US008608851B2

(12) United States Patent
Ni et al.

(10) Patent No.: US 8,608,851 B2
(45) Date of Patent: Dec. 17, 2013

(54) PLASMA CONFINEMENT APPARATUS, AND METHOD FOR CONFINING A PLASMA

(75) Inventors: Tom Ni, Pleasanton, CA (US); Jinyuan Chen, Union City, CA (US); Qing Qian, San Jose, CA (US); Yuehong Fu, Fremont, CA (US); Zhaoyang Xu, Shanghai (CN); Xusheng Zhou, Shanghai (CN); Ye Wang, Shanghai (CN)

(73) Assignee: Advanced Micro-Fabrication Equipment, Inc. Asia, George Town, Grand Cayman (KY)

( * ) Notice: Subject to any disclaimer, the term of this patent is extended or adjusted under 35 U.S.C. 154(b) by 1798 days.

(21) Appl. No.: 11/546,041

(22) Filed: Oct. 10, 2006

(65) Prior Publication Data
US 2007/0085483 A1 Apr. 19, 2007

(30) Foreign Application Priority Data

Oct. 14, 2005 (CN) .......................... 2005 1 0030576
Sep. 22, 2006 (CN) .......................... 2006 1 0116449

(51) Int. Cl.
*C23C 16/00* (2006.01)

(52) U.S. Cl.
USPC .................. 118/715; 118/723 E; 156/345.29; 156/345.47; 315/111.71

(58) Field of Classification Search
USPC ............ 118/715, 723 E; 156/345.29, 345.47; 315/711.71
See application file for complete search history.

(56) References Cited

U.S. PATENT DOCUMENTS

| 5,534,751 | A |   | 7/1996  | Lenz et al. |
| 5,556,474 | A | * | 9/1996  | Otani et al. ............... 118/723 E |
| 5,998,932 | A |   | 12/1999 | Lenz |
| 6,178,919 | B1 | * | 1/2001 | Li et al. ..................... 118/723 E |
| 6,254,683 | B1 | * | 7/2001 | Matsuda et al. ............. 118/500 |
| 6,562,189 | B1 |   | 5/2003  | Quiles et al. |
| 6,887,340 | B2 |   | 5/2005  | Dhindsa et al. |
| 2001/0014540 | A1 | * | 8/2001 | Shan et al. .................... 438/710 |
| 2004/0033385 | A1 | * | 2/2004 | Kaushal et al. ............... 428/627 |
| 2004/0129218 | A1 | * | 7/2004 | Takahashi et al. ........... 118/715 |
| 2005/0039682 | A1 | * | 2/2005 | Dhindsa et al. ........... 118/723 E |
| 2005/0103440 | A1 | * | 5/2005 | Sato et al. ................ 156/345.29 |
| 2005/0145176 | A1 | * | 7/2005 | Wicker ...................... 118/723 R |
| 2005/0194099 | A1 | * | 9/2005 | Jewett et al. ............. 156/345.48 |
| 2006/0118045 | A1 | * | 6/2006 | Fink .......................... 118/723 R |
| 2006/0118518 | A1 | * | 6/2006 | Rusu et al. ..................... 216/67 |

\* cited by examiner

*Primary Examiner* — Jeffrie R Lund
*Assistant Examiner* — Satish Chandra
(74) *Attorney, Agent, or Firm* — Nixon Peabody LLP; Joseph Bach, Esq.

(57) ABSTRACT

A plasma confinement apparatus, and method for confining a plasma are described and which includes, in one form of the invention, a plurality of electrically insulated components which are disposed in predetermined spaced relation, one relative to the others, and surrounding a processing region of a plasma processing apparatus, and wherein a plurality of passageways are defined between the respective insulated components; and at least one electrically conductive and grounded component forms an electrical field shielding for the processing region.

11 Claims, 12 Drawing Sheets

FIG. II

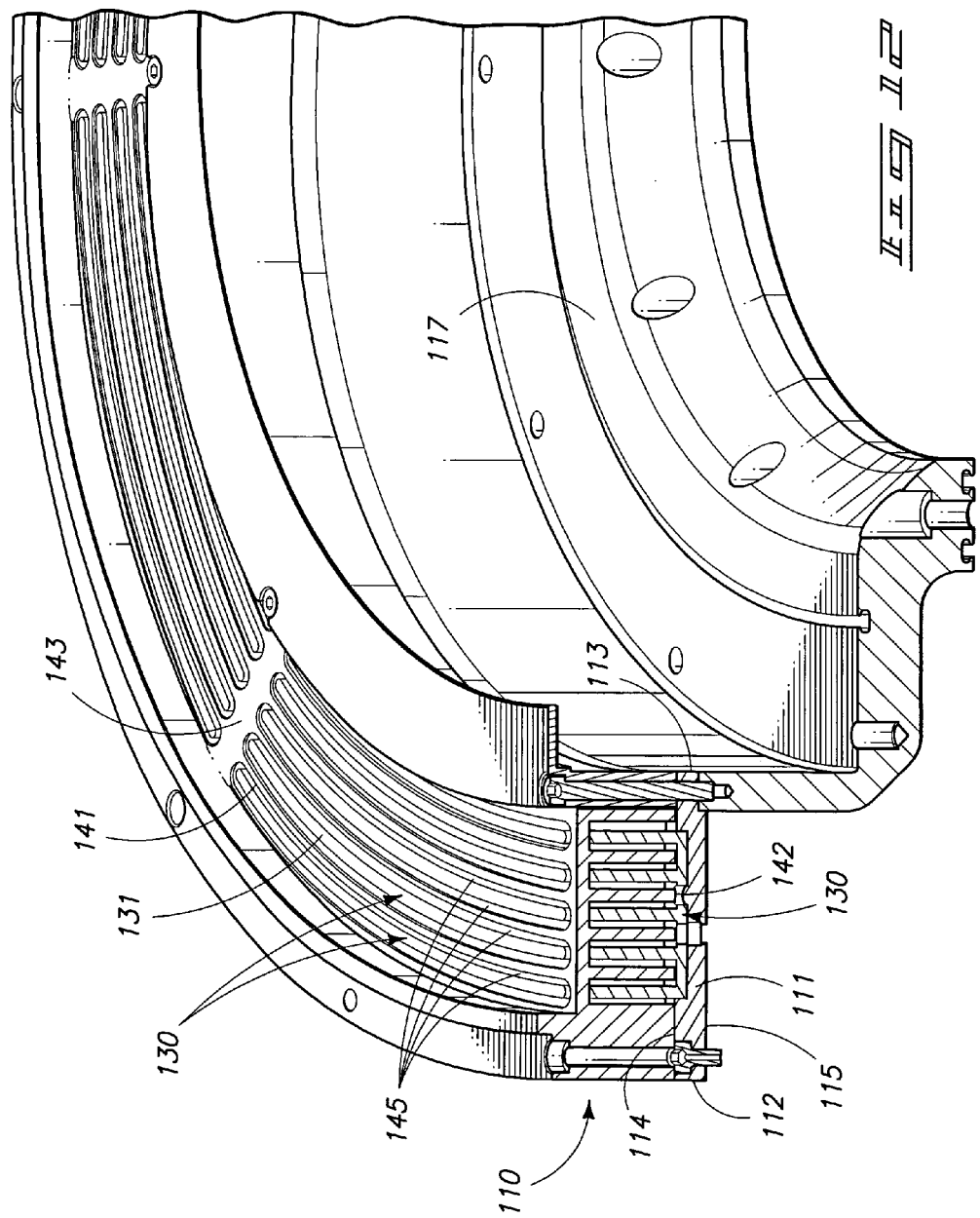

PLASMA CONFINEMENT APPARATUS, AND METHOD FOR CONFINING A PLASMA

RELATED PATENT DATA

This application claims priority from Chinese Patent Application Serial Nos. 200510030576.3, which was filed on Oct. 14, 2005, and 200610116449.X and which was filed on Sep. 22, 2006.

TECHNICAL FIELD

The present invention relates to a plasma confinement apparatus for use in semiconductor processing, and related method for confining a plasma, and more specifically to an arrangement which provides electrical field shielding for a processing region within a plasma processing apparatus.

BACKGROUND OF THE INVENTION

The operation of a plasma processing apparatus, and similar devices in connection with the fabrication of semiconductor substrates or flat panel displays of various types are well known. In this regard, such assemblies include a chamber housing a pair of essentially planar electrodes that are spaced in substantially parallel relation to define a reaction space therebetween. On a first of the electrodes is positioned a semiconductor wafer to be processed. For such processing to occur, an appropriate gaseous medium is introduced into the chamber, and then one or more suitable high radio frequency voltages are applied across the pair of electrodes to generate an electrical discharge which forms a plasma therebetween the electrodes. This plasma etches or otherwise suitably processes the semiconductor wafer in an appropriate fashion.

Such chambers, of course, may be used to etch material previously deposited on the semiconductor wafer, or may be employed to deposit materials onto the same semiconductor wafer. In these previous prior art assemblies, and more specifically in capacitive plasma reactors, the radio frequency power may be supplied to one or both of the electrodes, and any capacitive discharge takes place between these parallel electrodes. It has been well known that it is important, from an efficiency, and uniformity standpoint, to confine the resulting plasma essentially to the interaction space between the two electrodes. It is understood, however, that some plasma may permeate or move throughout the whole processing chamber. If this occurs, erosion or deposition may take place in these remote regions causing a resulting particle contamination in the reaction chamber thus lowering the performance and yield rates that can be produced from the same reaction chamber. Still further, this deposition and erosion may shorten the lifespan of the reaction chamber or its components. In addition to the foregoing, if plasma is not confined within the processing region charged particles produced by the plasma may collide with unprotected regions of the reaction chamber causing further impurities, particulate matter, and contamination to be generated and which may result in the contamination of the surface of any semiconductor substrates which are being processed in the chamber.

The prior art is replete with numerous examples of devices, and methodology which have attempted to solve the difficulties associated with plasma confinement. For example, U.S. Pat. No. 6,562,189, the teachings of which are incorporated by reference herein, discloses a plasma chamber which employs a plasma-confining magnet assembly to inhibit the diffusion of the plasma. While this arrangement has operated with some degree of success, its principal shortcoming is that if the magnetic field of the magnet is too strong, it may potentially damage electrically sensitive components which are located on a semiconductor substrate that is being processed. Obviously, if the magnet employed with such an assembly is too weak, the plasma diffusion cannot be effectively confined, and the resulting contamination, noted above, results. In addition to the foregoing, U.S. Pat. No. 5,534,751 discloses a plasma etching apparatus, including a stack of quartz rings which are spaced apart to form slots therebetween, and when are positioned so as to surround an interaction or reaction space between the two electrodes of the apparatus. In the arrangement as disclosed, and when charged particles such as ions or electrons pass through the narrow gaps defined by the quartz ring, many of the charged particles will collide with the surface of the quartz ring thus substantially confining the plasma diffusion. However, the principal shortcoming in this device is that this arrangement cannot completely prevent charged particles from leaking outside the processing region nor can it completely prevent the leakage of electromagnetic waves or prevent a secondary radio frequency discharge of the leaked charged particles outside the processing region. Consequently, contamination can still be generated.

In addition to the foregoing, U.S. Pat. No. 5,998,932 relates to a focus ring arrangement for substantially eliminating unconfined plasma in a plasma processing chamber, and which uses grounded conducting extensions to substantially reduce the density of eqipotential lines outside the processing region. This apparatus, in principal, is supposed to reduce the collision of leaked charged particles with the wall of the reaction chamber outside of the processing region so as to prohibit the generation of unwanted plasma. This unwanted plasma is caused by the electric field outside the processing region. In practice, however, this method has shown that it cannot completely prevent the formation of an electric field outside the processing region.

Still further, in U.S. Pat. No. 6,178,919, a perforated plasma confinement ring, and a plasma reactor is disclosed, and which includes a sealing ring made of a conducting material which includes apertures or holes that permit a reaction gas to escape from the processing region. This conductive sealing ring is grounded, and absorbs electrons in the exhaust reaction gas thus neutralizing the charge, and thereby reduces the number of electrons in the plasma, and further increases the density of ions within the processing region. While this device works with some degree of success it should be understood that the collision of ions of the plasma onto the surface of the conductive sealing ring may cause contamination to be generated in the chamber, and other electrical discharges.

From a detailed study of the prior art patents noted, above, it will be seen that principally two existing methods are used in the industry to confine plasma. A first method is to confine the plasma with an insulating sealing ring that physically blocks the plasma exhaust gas. Further, a second method is to confine the plasma by adjusting the resulting electrical field.

A plasma confinement apparatus, and method for confining a plasma which avoids the shortcomings attendant with the prior art devices and practices, and methodology which have been utilized heretofore is the subject matter of the present application.

SUMMARY OF THE INVENTION

A first aspect of the present invention includes a plasma confinement apparatus for use in a plasma processing apparatus, and which is positioned between a processing region and an exhaust region of the plasma processing apparatus, and which further includes at least one electrically insulating component having a plurality of passageways; and at least one electrically conductive and grounded component which forms an electrical field shielding for the processing region, and wherein the electrically insulating component is made integral, at least in part, with the electrically conductive and grounded component.

Another aspect of the present invention relates to a plasma confinement apparatus for use in a plasma processing apparatus, and which is positioned between a processing region and an exhaust region of the plasma processing apparatus, and which further includes an electrically grounded member; and an electrically conductive member which is positioned on the electrically grounded member and electrically insulated relative thereto, and which further defines a plurality of passageways through which a plasma may pass between the processing region and the exhaust region, and wherein the plasma has charged species and neutral species, and wherein the plurality of passageways are sized so as to quench the charged species and allow the neutral species to pass therethrough.

Still another aspect of the present invention relates to a plasma confinement apparatus for use in a plasma processing apparatus, and which is positioned between a processing region and an exhaust region of the plasma processing apparatus, and which includes an electrically grounded plate having a top surface; an electrically insulative layer positioned at least in partial covering relation relative to the top surface of the electrically grounded plate; and a plurality of spaced, electrically conductive components which are electrically coupled together, and which are positioned between the processing region and the exhaust region, and wherein at least one of the electrically conductive components is, at least in part in contact with the electrically insulative layer.

Yet another aspect of the present invention relates to a plasma confinement apparatus which includes an electrically grounded member which defines at least one passageway extending therethrough; an electrically insulative layer positioned at least in partial covering relation relative to the electrically grounded member; a first plurality of spaced substantially concentrically oriented and electrically conductive rings which rest on the electrically insulative layer, and which are disposed in spaced relation relative to the electrically grounded member; and a second plurality of spaced substantially concentrically oriented and electrically conductive rings which matingly interfit and cooperate with the first plurality of electrically conductive rings, and wherein the first and second plurality of electrically conductive rings define a plurality of passageways therebetween which are sized so as to quench a charged species of a plasma and further allow a neutral species of the same plasma to pass therethrough.

These and other aspects of the present invention will be described in greater detail hereinafter.

BRIEF DESCRIPTION OF THE DRAWINGS

Preferred embodiments of the invention are described below with reference to the following accompanying drawings.

FIG. 12 is a fragmentary, transverse, vertical, sectional view of the plasma confinement apparatus embodiment as seen in FIG. 11 and which is shown as it is installed on a plasma processing apparatus.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
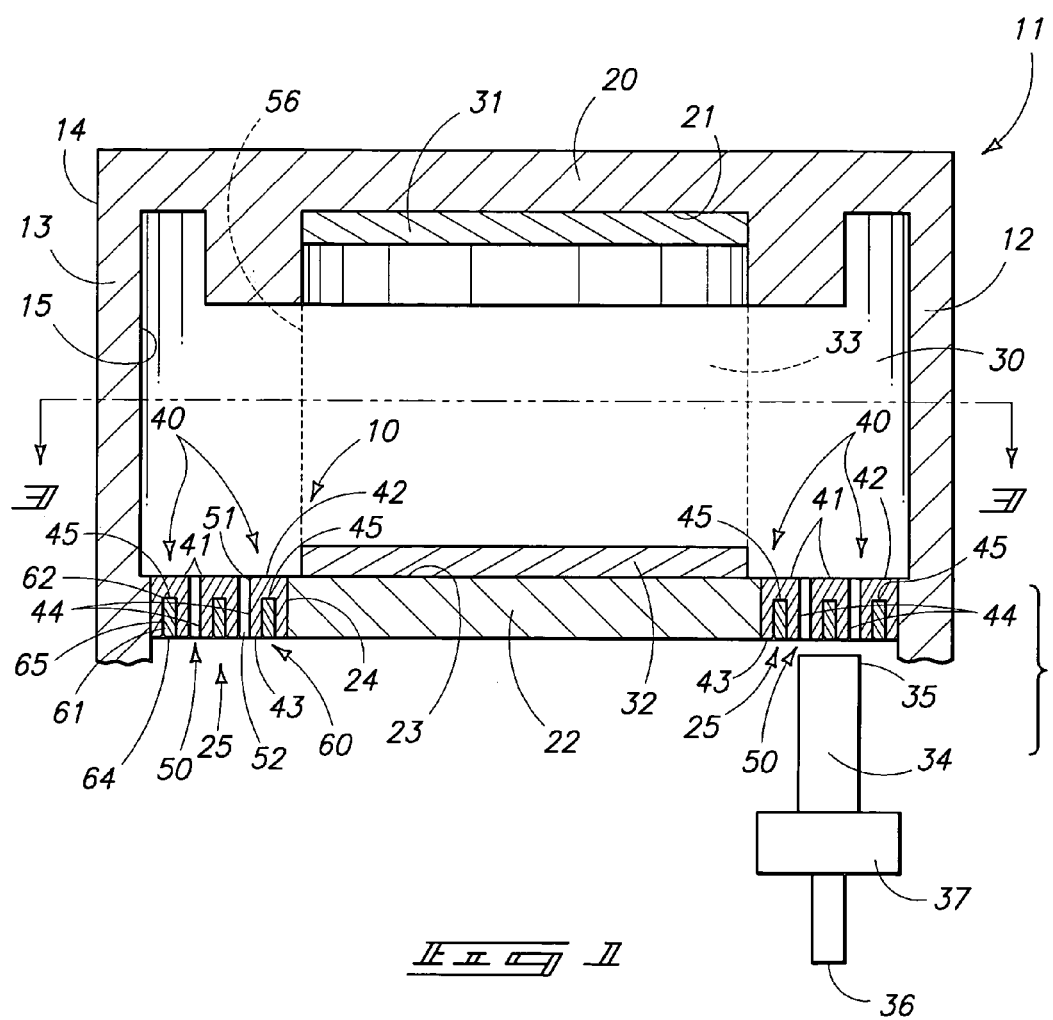
FIG. 1 is a greatly simplified transverse, vertical, sectional view of one embodiment of a plasma confinement apparatus of the present invention.

Referring now to FIG. 1, a first form of the plasma confinement apparatus of the present invention is generally indicated by the numeral 10. The present invention is made integral with a plasma processing apparatus which is generally indicated by the numeral 11. As seen in FIGS. 1-8, the plasma processing apparatus 11 includes a processing chamber which is generally indicated by the numeral 12, and which is defined by a substantially vertically oriented and cylindrically shaped sidewall 13. In one form of the invention, the processing chamber is electrically conductive. The sidewall 13 has an outside facing surface 14, and an opposite inside facing surface 15. Still further, the plasma processing chamber 12 has a top portion 20, which is defined, in part, by an inside facing surface 21. Further, the processing chamber 12 has a bottom portion 22 which has an inside facing surface 23. The top portion 20 is joined to the sidewall 13. Still further, the bottom portion 22 is defined by a peripheral edge 24. As seen in FIG. 1, and in several forms of the invention as illustrated in FIGS. 1-8, a gap or space 25 is defined between the peripheral edge 24, and the inside facing surface 15 of the sidewall 13. The inside facing surfaces 15, 21 and 23 of the processing chamber 12 define an internal cavity 30, within which the semiconductor wafers, or other assemblies are processed.

As illustrated in FIGS. 1-8, a first or upper electrode 31 is positioned or otherwise mounted on the inside facing surface 21 of the top portion 20, and a second or bottom electrode 32 is affixed or otherwise mounted on the inside facing surface 23 of the bottom portion 22. As should be understood, the plasma processing apparatus 11 defines a processing region 33 which is located therebetween the first or upper electrode 31, and the second or bottom electrode 32. As earlier discussed, electrical potential (RF) provided either to the first or second electrode, or to both, is operable to ignite, energize, or otherwise facilitate the formation and maintenance of a plasma in the processing region 33. This plasma may contain both neutral as well as charged particles or species. In the arrangement as seen in the drawings, a workpiece to be processed such as a semiconductor wafer (not shown) is placed above the second or lower electrode 32. This workpiece can be a semiconductor substrate to be etched or a glass panel that is to be processed into a flat panel display. A reaction gas, not shown, is then introduced by way of a gas introduction port, not shown in the drawings, into the internal cavity 30. As noted above, one or more remote RF generators can apply RF energy to the bottom electrode 32, the upper electrode 31; or both electrodes to generate an electrical field within the internal cavity 30, and more specifically to the processing region 33. As should be understood, the electrical field defined between the first or upper electrode 31, and the second or bottom electrode 32 has the effect of accelerating electrons in the processing chamber 12 so as to cause them to collide with the molecules of the reaction gas introduced into the internal cavity 30, and form the neutral and charged species. These collisions ionize the reaction gas, and result in an excitement of the resulting plasma. It is well known that neutral molecules of the reaction gas tend to lose electrons in the strong electrical field generated between the first and second electrodes 31 and 32, and are thereby left with a positive charge. These positively charged ions then accelerate towards the lower or bottom electrode 32, and can chemically combine with material which is made integral with the workpiece in the manner of a deposition, or achieve other processes such as etching.

Figure 2:
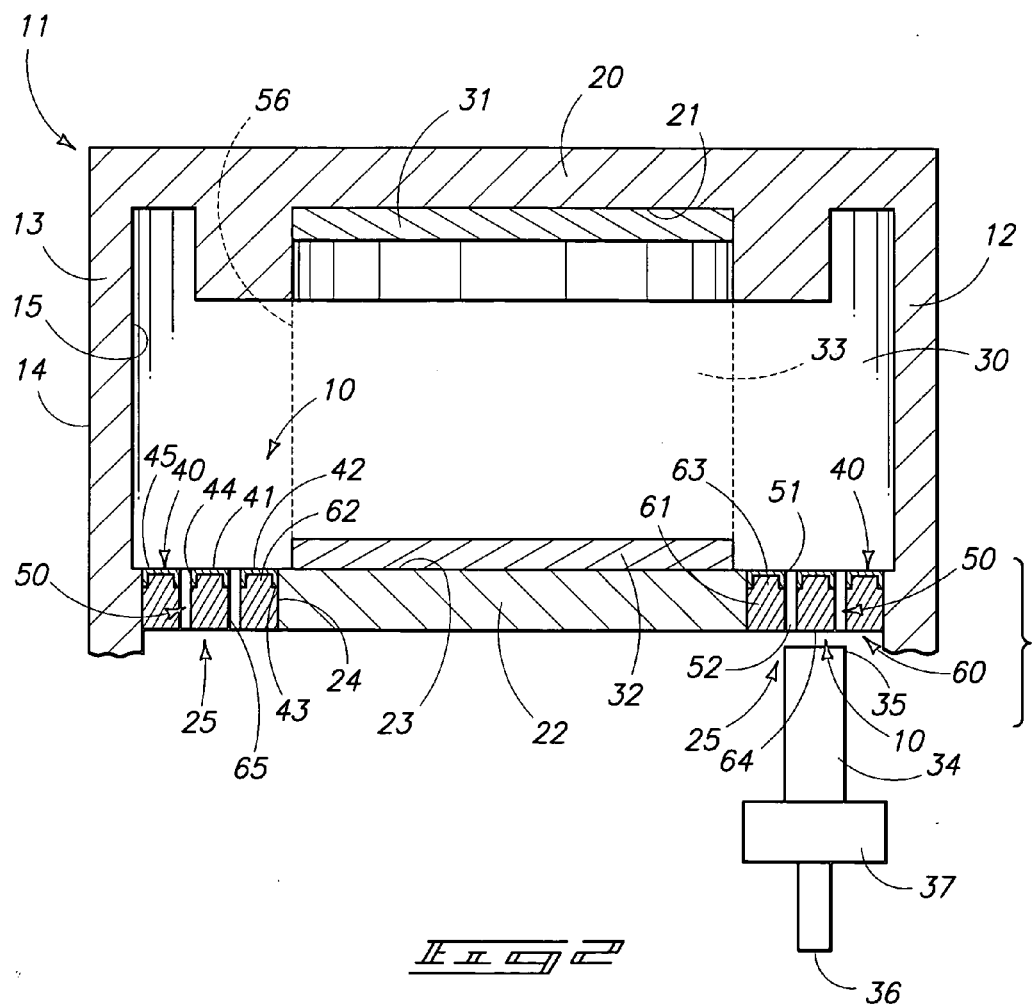
FIG. 2 is a greatly simplified transverse, vertical, sectional view of yet another embodiment of the present invention.
Figure 3:
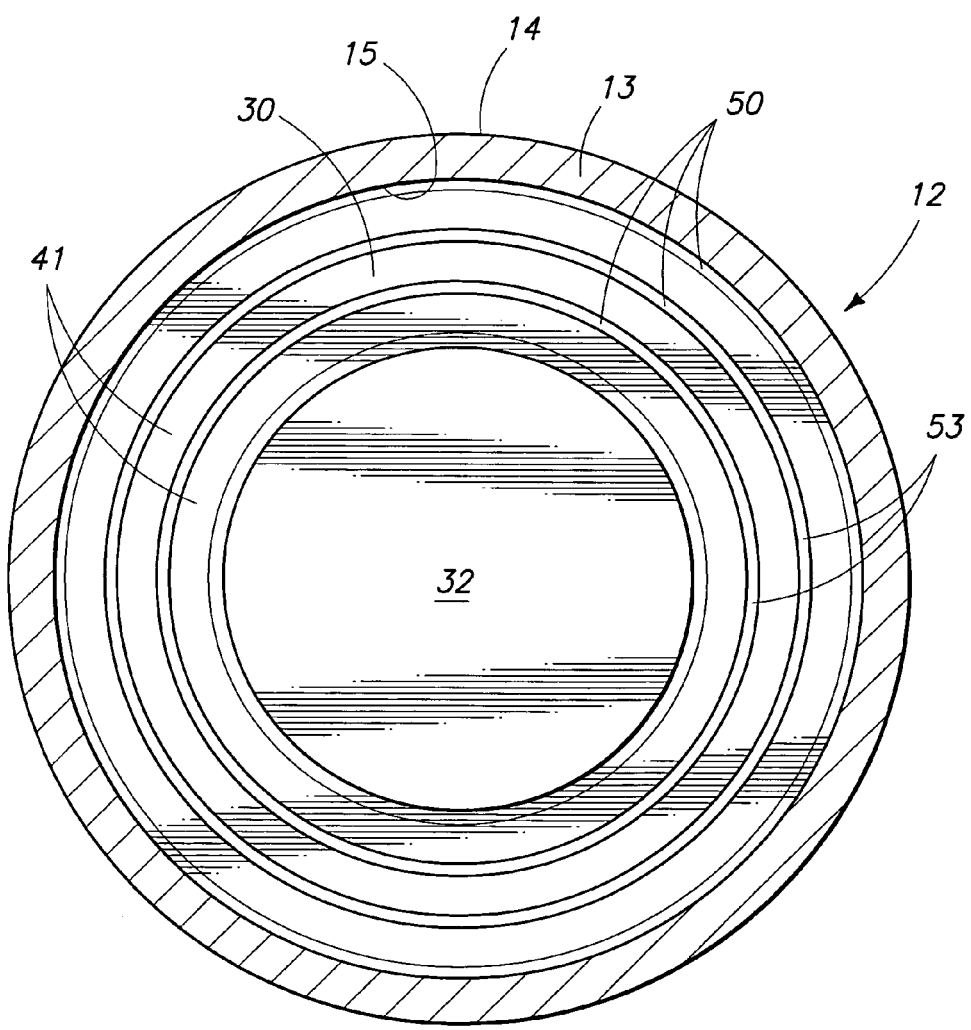
FIG. 3 is a transverse, vertical, sectional view taken from a position along line 3-3 of FIG. 1.
Figure 4:
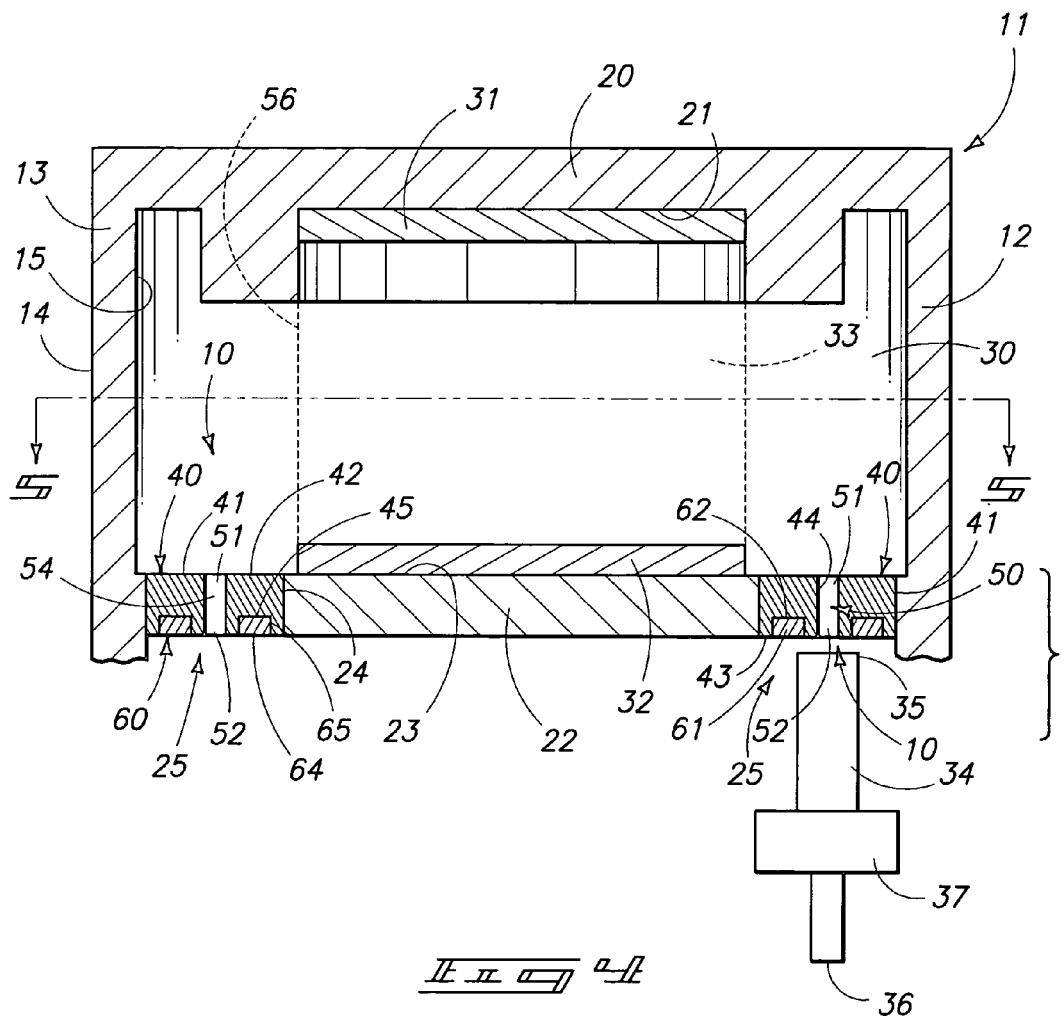
FIG. 4 is a greatly simplified transverse, vertical, sectional view of yet another embodiment of the present invention.

Referring more specifically to FIGS. 1-3, and in one form of the invention, the plasma confinement apparatus 10 of the present invention is employed to create a plasma discharge within the processing region 33, and which is located between the first or upper electrode 31, and the bottom or lower electrode 32, and thereby minimize any unwanted secondary plasma discharge outside of the processing region 33. As seen in these views, the plasma confinement apparatus 10 of the present invention is located or otherwise oriented around or about the processing region 33, and further positioned between the processing region 33 and an exhaust region which will be discussed, below. In the arrangement as seen in the drawings, the plasma processing apparatus 11 of the present invention further includes an exhaust passageway 34 which has a first intake end 35 which is located in fluid flowing relation relative to the gap 25, and which is defined between the peripheral edge 24 of the bottom portion 22, and the inside facing surface 15 of the processing chamber 12. Further, the exhaust passageway includes a second exhaust end 36 which is remote thereto. The exhaust passageway 34 is coupled to an exhaust apparatus or gas movement assembly 37 which is operable to withdraw used reaction gas which has been employed within the internal cavity 30, and exhaust it therefrom. The exhaust passageway and exhaust apparatus generally define an exhaust region of the plasma processing apparatus. As seen in FIGS. 1-8, and in several forms of the invention as seen in those views, the plasma confinement apparatus 10 is located within, and at least partially occludes the gap or space 25 which is defined between the peripheral edge 24 of the bottom portion 22, and the inside facing surface 15 of the sidewall 13. As will be seen from the drawings, the orientation of the invention in this location positions the plasma processing apparatus 11 between the inside facing surface 15, and the peripheral edge of the second or bottom electrode 32.

The plasma confinement apparatus 10 of the present invention as seen in FIGS. 1-8, includes a plurality of electrically insulating components which are generally indicated by the numeral 40 and which are disposed in predetermined spaced relation one relative to others, and which further surround the peripheral edge of the processing region 33 of the plasma processing apparatus 11, and are located between the processing region 33 and the exhaust region which is defined by the exhaust passageway 34 and exhaust apparatus 37. In this regard, at least one of the plurality of insulating components 40 are fabricated, at least in part, from a material which is selected from the group comprising SiC; $Si_3N_4$; $Al_2O_3$; AlN; and $Si_3N_4$. The respective insulating components have a main body 41 which has a first or upper surface 42 which faces generally in the direction of the processing region 33, and an opposite second surface 43 which faces away from the same processing region. Still further, each of the insulating components have opposite sidewalls 44 which are generally planar, and which are substantially normal relative to the first surface 42. As should be understood, the sidewalls 44 may take on other geometries as will become more apparent from the discussion which follows. Further, in some forms of the invention as seen in FIGS. 1-8, the main body 41 defines a cavity 45 therewithin, and which is operable to receive an electrically conductive and grounded component which will be discussed in greater detail in the paragraphs which follow. Additionally, it should be noted that at least one of the electrically insulating components 40 is located in contact with at least a portion of the plasma which is generated in the processing region 33.

Figure 5:
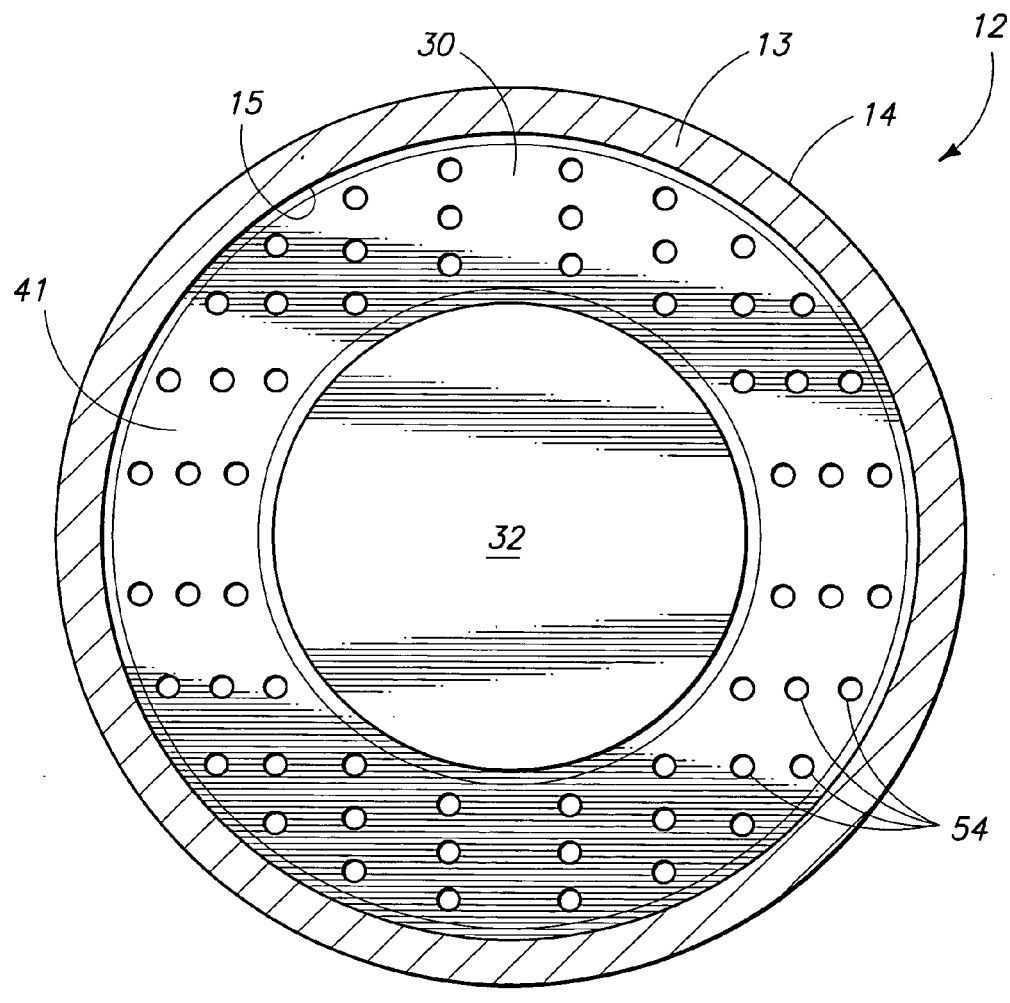
FIG. 5 is a transverse, vertical, sectional view taken from a position along line 5-5 of FIG. 4.
Figure 6:
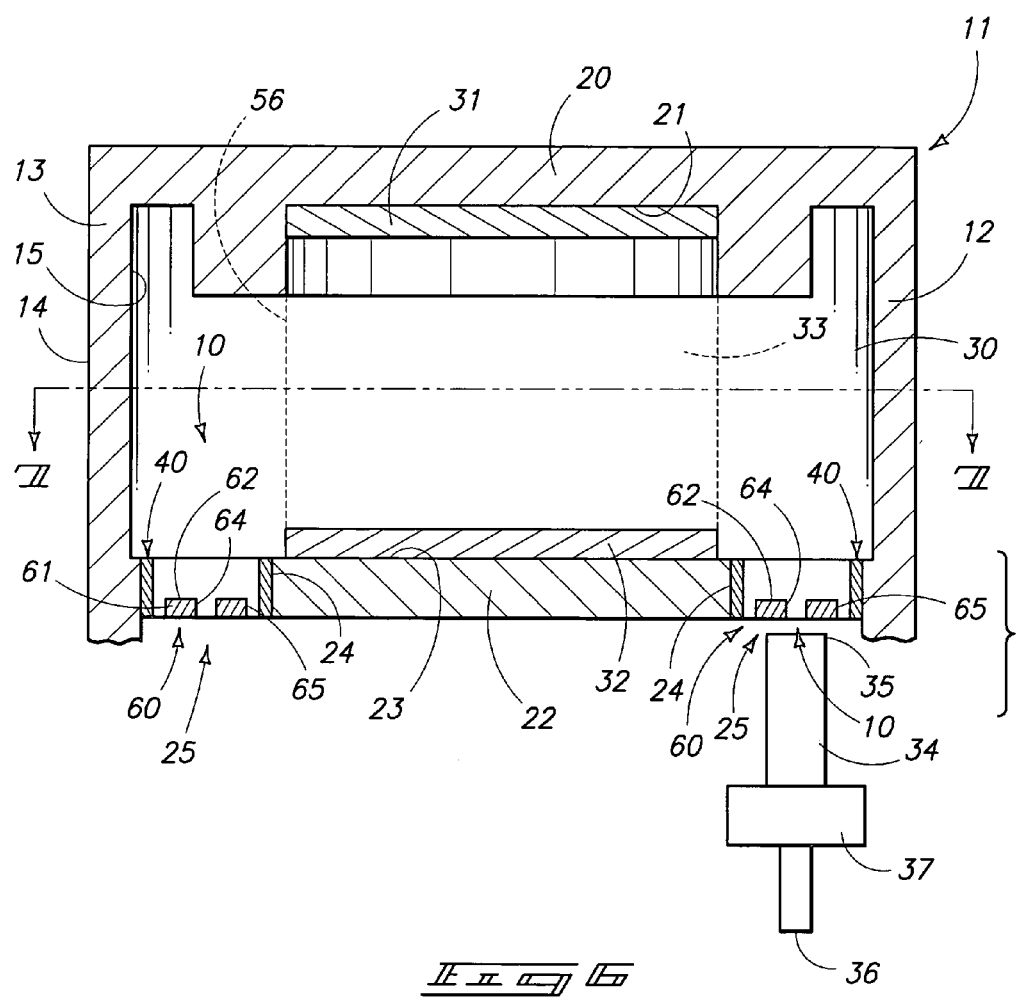
FIG. 6 is a greatly simplified transverse, vertical, sectional view of yet another embodiment of the plasma confinement apparatus of the subject invention.
Figure 7:
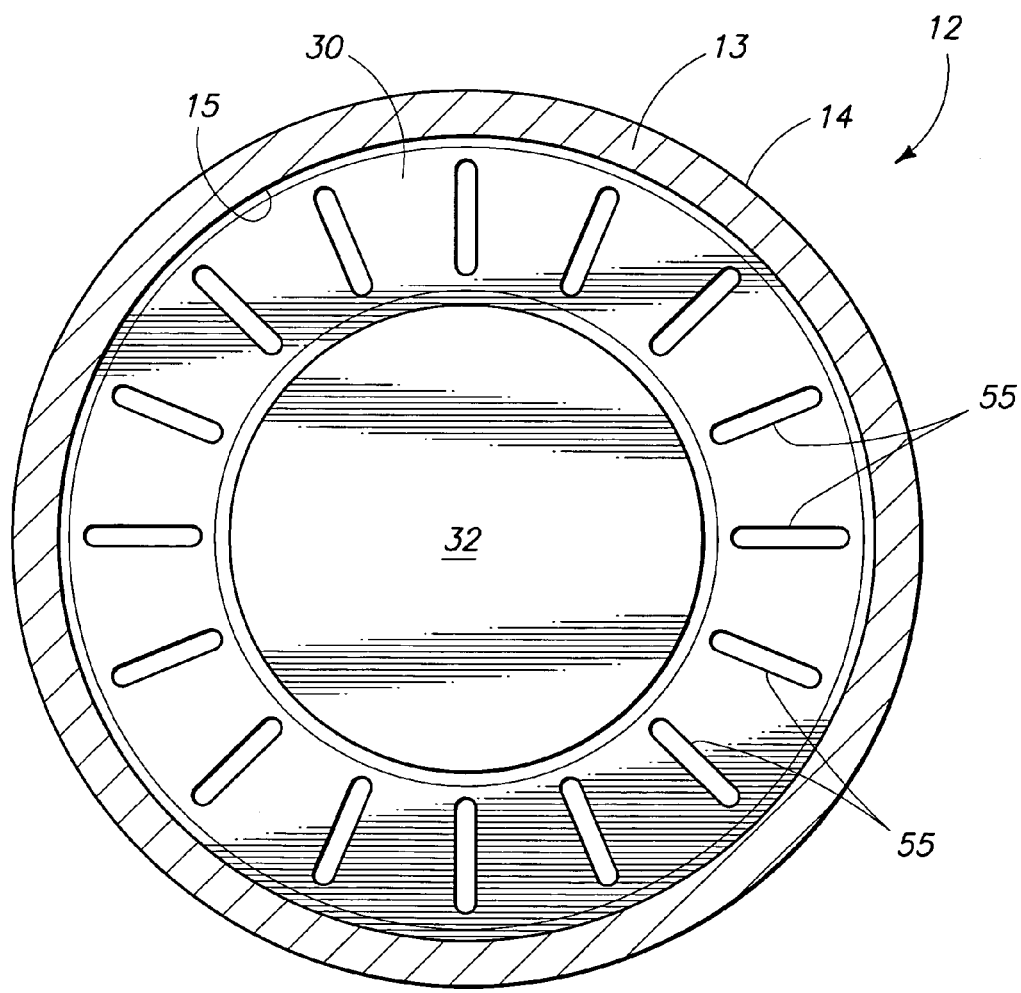
FIG. 7 is a transverse, vertical, sectional view taken from a position along line 7-7 of FIG. 6.

As seen in the drawings and in one form of the invention, a plurality of narrow passageways which are generally indicated by the numeral 50 are defined between the respective insulating components 40. Still further, and in another form of the invention as seen, for example, in FIG. 5, at least one of the insulating components 40 may have a plurality of passageways 54 formed therein. As illustrated in the drawings, the respective narrow passageways have a first end 51 which is located in fluid flowing relation relative to the internal cavity 30, processing region 33; and a second end 52 which is disposed in fluid flowing relation relative to the exhaust passageway 34. These passageways, in one form of the invention, are substantially straight and uniformly dimensioned passageways. However, and depending upon the geometry of the sidewalls 44, the passageway may take on other shapes such as curved, angulated or the like. As should be understood, the gas movement assembly or exhaust apparatus 37 withdraws the reaction by-product gas from the processing region 33, and through the respective narrow passageways 50, and the exhaust passageway 34. In the arrangement as seen in the drawings, the plurality of insulating components 40 may, in one form of the invention, be individual concentric insulating rings, and wherein the passageways 50 of this form of the invention are continuous concentric passageways which are generally indicated by the numeral 53 as seen in FIG. 3. In other forms of the invention, the electrically insulating component 40 may comprise a single member, and the plurality of narrow passageways 50 may comprise individual substantially round passageways 54 as seen in FIG. 5; and/or linearly narrow passageways 55 as seen in FIG. 7. As earlier discussed, the plasma processing apparatus 11 produces from a source of a reaction gas, a gaseous plasma having charged particles or species within the processing region 33. These charged particles move within the plasma formed in the processing region, and each has a mean-free path length. The narrow passageways 50 defined therebetween the respective spaced insulating components 40 have a length dimension which is larger than the mean-free path length of the charged particles in the plasma. This arrangement prevents a plasma from being generated outside the internal cavity 30 or processing region 33 of the plasma processing apparatus 11. As seen in FIGS. 1-4, 6 and 8, for example, the processing region 33 is generally defined by a peripheral edge 56, and the plurality of electrically insulating components 40 are located about the peripheral edge 56 of the processing region 33, and further have a first surface 42 which faces in the direction of the plasma processing apparatus 11.

The plasma confinement apparatus 10 of the present invention further includes at least one electrically conductive, and grounded component which is generally indicated by the numeral 60, and which is operable to form an electrical field shielding for the processing region 33. In the arrangement as seen in the drawings, the insulating component 40 is made integral, at least in part, with the electrically conductive and grounded component 60. In the drawings, it will be noted that the at least one electrically conductive and grounded component may comprise a plurality of electrically conductive and grounded components. Still further, the individual insulating components 40 are made integral, at least in part, with each of the electrically conductive and grounded components 60. In some forms of the invention, the plurality of electrically conductive and grounded components 60 may comprise individual electrically conductive rings. In the arrangement as seen in FIGS. 1-8, it should be understood that the plurality of electrically conductive and grounded components 60 are typically electrically coupled together, and further are electrically coupled to the electrically grounded processing chamber 12 in one possible form of the invention. Still further, in other forms of the invention as seen in FIGS. 1-8, the plurality of electrically conductive and grounded components 60 are electrically coupled together, and are further electrically coupled to the electrically grounded shell (not shown) of the bottom or lower electrode 32. Still further, and in another possible form of the invention, it should be understood that the electrically conductive and grounded components are electrically coupled together, and electrically grounded in a fashion so as to form a resulting grid structure which facilitates the formation of an electrical field shielding for the processing region 33. In one form of the invention as seen in FIG. 2, the respective electrically conductive and grounded components 60 include a main body 61 having a top surface 62. In another form of the invention as seen in FIG. 2, the top surface is defined by a protruding portion 63 which is received in the cavity 45. Still further, the main body 61 includes a bottom surface 64 and sidewalls 65. The sidewalls in some forms of the invention as seen in FIGS. 1-8 define, at least in part, a portion of the plurality of narrow passageway 50 as earlier described. As noted above, and in some forms of the invention, the plurality of electrically conductive and grounded components are made integral with the second surface 43 of the respective electrically insulating components 40. Still further, they are electrically coupled together, and electrically grounded to form the resulting electrical field shielding for the processing region 30.

As best illustrated in FIG. 1, and in one form of the invention, at least one of the electrically conductive and grounded components 60 is substantially enclosed within the cavity 45 as defined by the at least one of the electrically insulating components 40. In other forms of the invention as seen in FIG. 2, at least one of the electrically conductive components 60 has a surface area which is covered, at least in part, by at least one of the insulating components 40. The individual electrically conductive components 60 may comprise, in some forms of the invention, individually electrically conductive rings. In the arrangement as seen in FIG. 2, a portion of the surface area of the electrically conductive components 60, and more specifically portions of the sidewall 65 thereof are exposed to at least one of the narrow passageways 50 defined between the plurality of electrically conductive components. In other forms of the invention, as best seen by reference to FIG. 1 and 4, at least one of the electrically conductive components 60 is substantially completely enclosed within the electrically insulating component. In still another form of the invention as seen in FIG. 6, at least one electrically conductive component 60 has a surface area which is covered, at least in part, by at least one of the insulating components 40, and further has a surface area which is exposed to at least one of the narrow passageways 50 defined between the plurality of electrically insulating components. In still another form of the invention, the electrically conductive component 60 may include regions which are exposed to the passageway and further other portions of the electrically conductive component may be completely enclosed or substantially enclosed within the cavity 45 as defined by the insulating components 40. In one form of the invention, a portion of the surface area of at least one of the electrically conductive and grounded components 60 are exposed to one of the passageways 50 in the region which is covered, at least in part, by the insulating components 40.

As seen in FIGS. 1-8, the plasma confinement apparatus of the present invention 10 is operable to simultaneously facilitate the rapid withdrawal of a reaction gas from the plasma processing chamber 12 and further effectively confines a plasma discharge to the processing region 33. As earlier discussed, the respective insulating components 40 have a first or top surface 42 and sidewall 44 which defines, in part, the narrow passageways 50 which are located between the multiple insulating components 40. As should be understood, the charged particles or species formed in the plasma typically will collide with the first or top surface 42 of the respective insulating components 40 when pumped from the cavity 30 by an exhaust apparatus 37 so as to be expelled from same. Those charged particles which do not impact the top surface 42 will pass into the respective narrow passageways 50. In view of the mean free path length of the molecules, particles, or species, and the size and number of the narrow passageways 50, the charged particles of the plasma escaping from the processing region 33 will typically collide at least once, but typically several times when passing through the respective narrow passageways 50. As should be understood, these collisions neutralize the charge on the charged particles which have escaped from the processing region 33. The result is that the number of charged particles or species which find their way outside of the processing region is sharply reduced or completely eliminated. Consequently, the plasma discharge remains solely confined to the processing region 33. Therefore, any plasma discharge outside of the processing region 33, and in the exhaust region is completely eliminated. As should be appreciated from the earlier discussion, the multiple electrically conductive and grounded components may be, as earlier discussed, connected with the grounded electrically conductive processing chamber 12, or with the grounded shell of the second or bottom electrode 32. These grounded conducting components 60 can absorb escaping charged particles which collide onto the sidewalls 65 of same, thereby neutralizing the charge and thus presenting a secondary plasma outside of the processing region 30. In addition to the foregoing, the multiple electrically connected and grounded conducting components 60 can be coupled in a manner so as to form a grid structure and resulting RF electrical field shielding which shields the RF driving electric field, that is, the stray electric field that may stray or otherwise be located outside of the processing region 33 and along the radius of the lower electrode 32. It has been discovered that a reduction of this stray electrical field density which is located outside of the processing region 33 can greatly reduce the generation of a secondary plasma. Therefore, the present invention 10 not only absorbs and neutralizes escaping charged particles or species from the plasma formed in the processing region 30, but can also shield stray electrical fields thereby reducing the electrical field strength outside the processing region and thereby eliminate or reduce the generation of a secondary plasma. Therefore, the present invention provides several confinement mechanisms. A first confinement mechanism relates to the narrow passageways 50 as described above; and the second confinement mechanism relates to the electrically conductive and grounded components 60 which are effective in reducing any unwanted plasma outside of the processing region 33.

Figure 8:
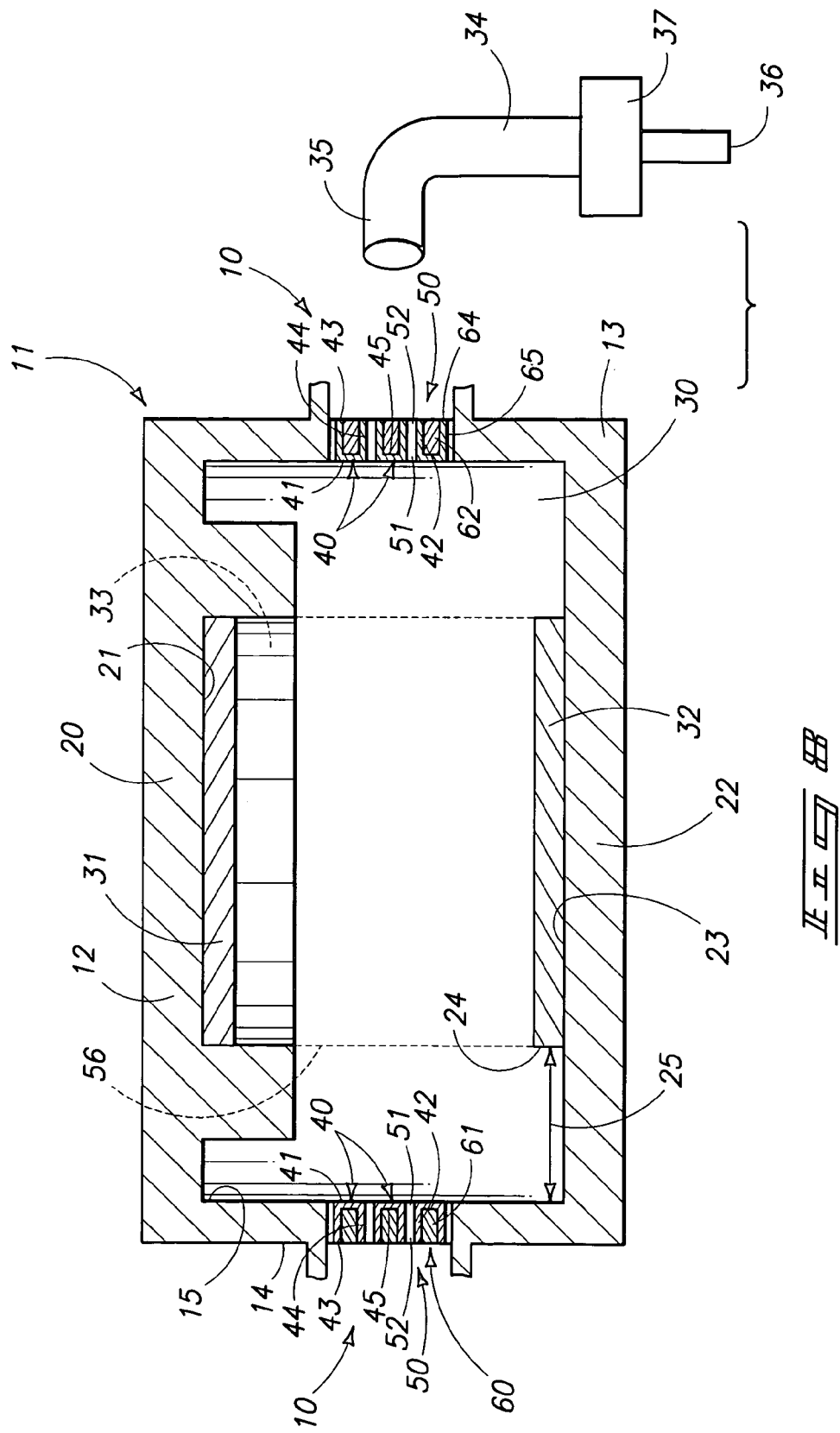
FIG. 8 is a greatly simplified transverse, vertical, sectional view of still another form of the plasma confinement apparatus of the present invention.

As seen in FIGS. 1-8, the invention 10 includes multiple forms and wherein the respective electrically conductive and grounded components 60 may be substantially entirely enclosed within the individual insulating components 40 as seen in FIGS. 1, 4, 6 and 8, or further, a portion of the main body 61 of the electrically conductive components may be exposed to the respective narrow passageways 50 as seen in FIG. 2, for example. Still further, in yet another form of the invention as seen in FIG. 6, the plurality of insulating components 40 may be placed, in part, along the sidewall 13. Still another form of the invention is seen in FIG. 8, and wherein the plasma confinement apparatus 10 of the present invention can be mounted or made integral with the sidewall 13 of the processing chamber 12. In all the forms of the invention as seen in FIGS. 1-8, the size of the narrow passageways 50 are designed to ensure that when charged particles or species from the plasma generated in the processing region 33 travel through the narrow passageway 50, the distance covered by the charged particle is larger than their respective mean free path length. This assures that substantially no charged particles may escape the processing region to form a secondary plasma. The multiple conducting components 60, as discussed earlier, may have variations in their geometry. They may assume the forms of a rectangle; triangle; inverse T; fingertip; etc. As earlier discussed, the narrow passageways 50 in this invention can be round holes, slots or concentric rings. Still further, the narrow passageways 50 defined therebetween the plurality of insulating components 40 may have a linear shape, angulated or curved orientation. The present invention may be employed in plasma processing deposition devices and plasma etching devices of various designs.

Therefore, one broad aspect of the present invention relates to a plasma confinement apparatus 10 which is positioned between a processing region 33 and an exhaust region 34, 37 of the plasma processing apparatus 10, and which includes at least one electrically insulating component 40 having a plurality of passageways 50; and at least one electrically conductive and grounded component 60 which forms an electrical field shielding for the processing region 33, and wherein the electrically insulating component 60 is made integral, at least in part, with the electrically conductive and grounded component 60.

Figure 9:
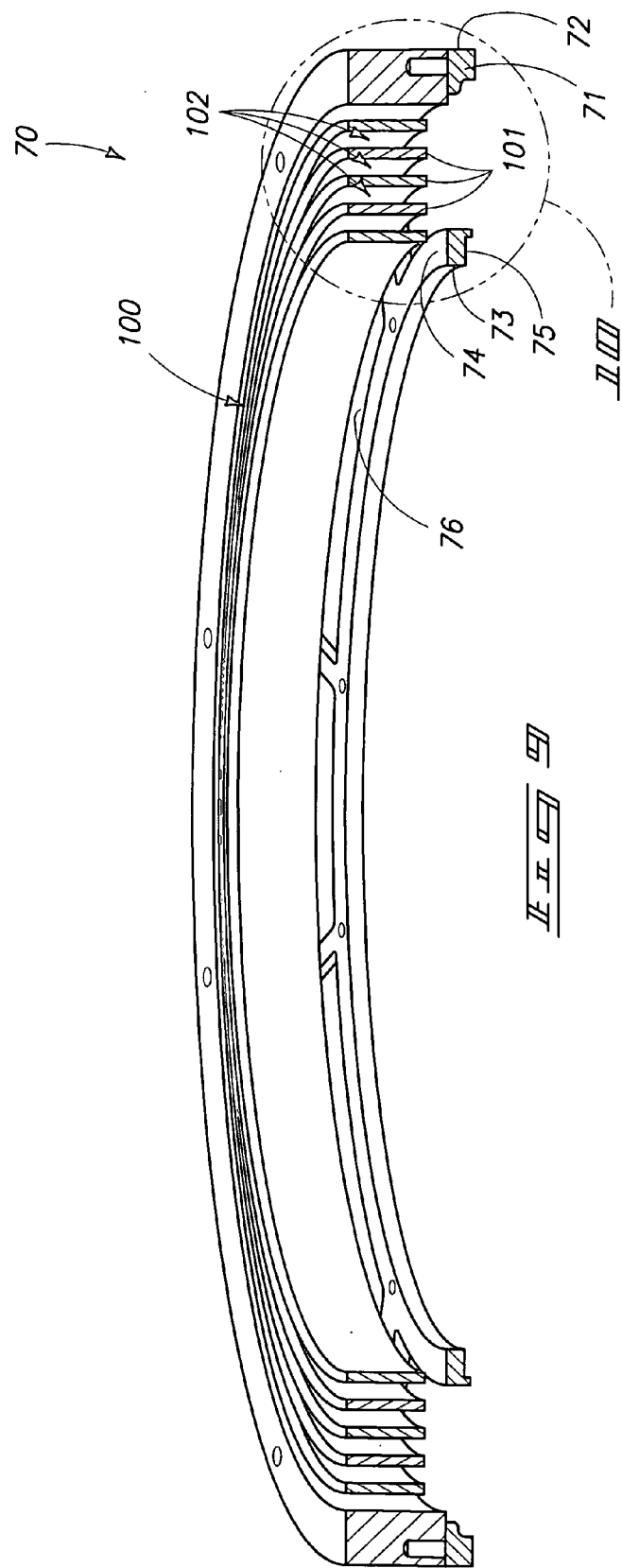
FIG. 9 is a transverse, vertical, sectional view of yet another embodiment of the plasma confinement apparatus of the present invention.
Figure 10:
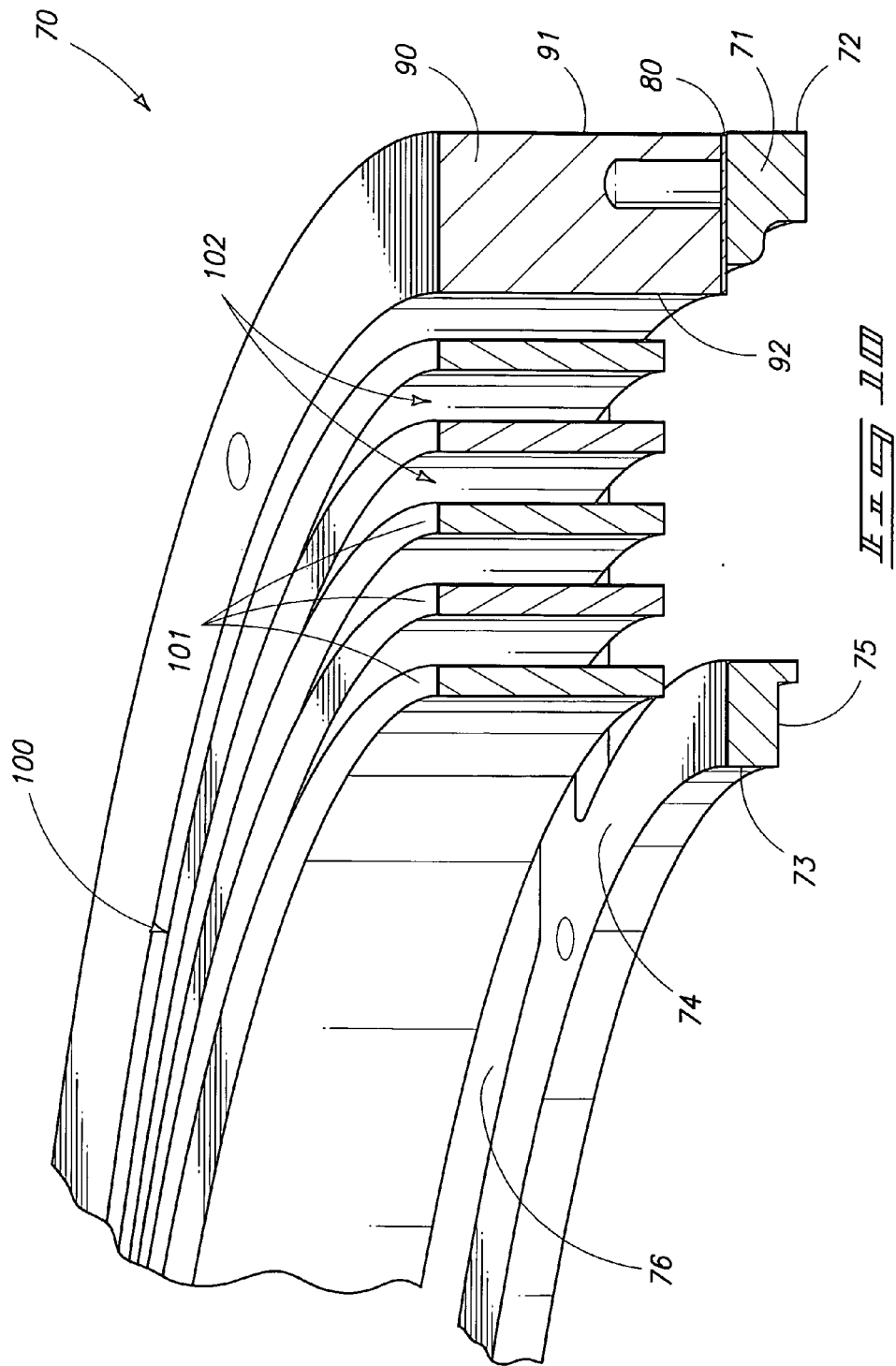
FIG. 10 is a fragmentary, enlarged vertical, sectional view of the embodiment of the plasma confinement apparatus as seen in FIG. 9.

Another form of the plasma confinement apparatus of the present invention is generally indicated by the numeral 70 in FIGS. 9 and 10, respectively. As seen therein, it will be understood that the plasma confinement apparatus 70 as seen in FIGS. 9 and 10 is for use in a plasma processing apparatus similar to that which was earlier described with respect to the earlier forms of the invention. The plasma confinement apparatus as seen in FIGS. 9 and 10 is positioned between a processing region and exhaust region of the plasma processing apparatus. These are not illustrated in the present view in order to facilitate an understanding of the present invention. The plasma confinement apparatus 70 as seen in FIGS. 9 and 10 includes, in part, an electrically grounded member which is generally indicated by the numeral 71. The electrically grounded member is grounded to the ground in a manner well known in the art. Additionally, the electrically grounded member is defined by an outside peripheral edge 72, and an opposite inside peripheral edge 73 which typically surrounds the lower electrode in the plasma processing apparatus, not shown. Still further, the electrically grounded member 71 has a top surface 74, and an opposite bottom surface 75. As illustrated, a plurality of passageways 76 are formed in a predetermined pattern in the electrically grounded member 71, and extend between the top and bottom surfaces 74 and 75, thereof. As should be understood, the electrically grounded member 71 is positioned therebetween the processing region and the exhaust region of the plasma processing apparatus, not shown. As should be understood, an RF emission is provided to the processing region of the plasma processing apparatus to energize a plasma. The electrically grounded member 71, which is provided, substantially inhibits RF emissions from reaching the exhaust region of the plasma processing apparatus to avoid the deleterious effects which were described earlier in this application.

As seen most clearly by reference to FIG. 10, the plasma confinement apparatus 70 of the present invention includes an electrically insulative layer 80 which is positioned on, or in partial covering relation relative to, the top surface 74 of the electrically grounded member 71. As seen in FIG. 10, the electrically insulative layer extends substantially radially, inwardly relative to the outside peripheral edge 72. The electrically insulative layer may comprise a single layer as illustrated, or multiple layers. Positioned or otherwise resting on the electrically insulative layer 80 is an electrically conductive support ring which is generally indicated by the numeral 90. The support ring has an outside peripheral edge 91 which is substantially co-planar relative to the outside peripheral edge 72 of the electrically grounded member, and further has an inside peripheral edge 92 which is spaced therefrom. The support ring 90 which is made integral with a plurality of electrically conductive members 100 orients the respective electrically conductive members 100 in predetermined spaced relation relative to, and electrically insulated from the electrically grounded member 71, so that the plurality of electrically conductive members 100 are electrically floating from ground during processing. The plurality of electrically conductive members are here illustrated as a plurality of spaced substantially concentric rings 101 which define a plurality of passageways 102 therebetween, and which are coupled in fluid flowing relation relative to the plurality of passageways 76 which are defined by the electrically grounded member 71. Therefore, the passageway 76 and 102, respectively form a fluid pathway which allows the processing gasses employed to form the plasma used in the processing region of the plasma processing apparatus to depart from the processing region, and travel to the exhaust region of the plasma processing apparatus. The electrically conductive components or members 100 may, in one form of the invention, be fabricated from a doped semiconductive material. In this arrangement, the doping of the semiconductive material increases the electrical conductivity of the semiconductive material.

As should be understood from a study of FIG. 10, and consistent with the teachings of the earlier forms of the invention, each of the passageways 102 which are defined by the plurality of concentric rings 101 have a length dimension which is larger than a mean free path length of any charged species which may exist within the plasma which is formed in the processing region of the plasma processing apparatus. Therefore, as the plasma passes from the processing region to the exhaust region any charged species passing through the passageways 102 have a tendency to strike the plurality of electrically conductive concentric rings 101 thereby quenching the charged species before the charged species reaches the exhaust region of the plasma processing apparatus. In the present invention as seen at FIGS. 9 and 10, it should be understood that the surfaces of the electrically conductive member 100, here shown as a plurality of electrically conductive and concentric rings 101 may be coated with, or enclosed within, a material which is substantially resistant to etching by the plasma which is produced in the processing region of the plasma processing apparatus. This is discussed in further detail below. In one possible form of the invention, the material which is coated onto the surfaces of the plurality of electrically conductive members 100 may comprise $Y_2O_3$. This surface coating ensures that the electrically conductive member 100 does not become etched by a plasma and thereby create particles. In still another possible form of the invention, the electrically conductive member 100 may comprise a plate which has slotted perforations or holes formed therein, and which is similar to the other earlier forms of the invention which have been described in this application.

Several alternative forms of the invention are possible, for example it should be understood that the surfaces of the electrically grounded member 71 and plurality of electrically conductive rings 101 which contact any plasma may be anodized in order to resist etching, and form electrically insulative layers thereon. It will be recognized that anodizing is a type of electrolysis which causes a protective oxide coating to be formed on a metal. Anodizing may serve several purposes including providing a tough coating on the surface of a metal, as well as imparting electrical insulation and corrosion resistance to the metal. In one form of the invention, the plurality of electrically conductive members 100, electrically conductive support ring 90, and the electrically grounded member 71 are formed of aluminum, and the electrically insulative layer 80 is an aluminum anodized layer which is formed by either anodizing the surface of the electrically conductive support ring 90 which faces toward the electrically grounded member 71, or anodizing the surface of the electrically grounded member 71 which faces toward the electrically conductive support ring 90. In another form of the invention, all surface areas of these same structures may be anodized. This ensures that the electrically conductive member 100 is electrically floating relative to the ground during processing. Still further, in yet another form of the invention, the surface areas of the plurality of electrically conductive rings which face in the direction of, or contact any plasma may first be anodized, and then later coated with $Y_2O_3$ which further resists etching. In addition to the foregoing, an electrically insulative spacer ring (not shown) may be oriented between the electrically conductive support ring 90, and the underlying electrically grounded member 71, and which ensures that the electrically conductive member 100 is electrically floating relative to ground. In this form of the invention, the electrically insulative layer 80, can be replaced by the electrically insulative spacer. This electrically insulative spacer, similarly causes the electrically conductive member 100 to become electrically floating from ground.

Therefore, a plasma confinement apparatus 70 for use in a plasma processing apparatus and which is positioned between a processing region and an exhaust region of the plasma processing apparatus includes an electrically grounded member 71; and an electrically conductive member 100 which is positioned on the electrically grounded member and electrically insulated relative thereto, and which further defines a plurality of passageways 102 through which a plasma may pass between the processing region and the exhaust region of the plasma processing apparatus, and wherein the plasma has charged species and neutral species, and wherein the plurality of passageways are sized so as to quench the charged species and allow the neutral species to pass therethrough. It will be seen that a plasma confinement apparatus 70 is illustrated in FIGS. 9 and 10, and wherein an electrically grounded member or plate 71 having a top surface 74 is shown, and which is positioned between the processing region and an exhaust region of the plasma processing apparatus; and which further includes an electrically insulative layer 80 positioned in partial covering relation relative to the top surface 74 of the electrically grounded plate. The invention further includes a plurality of spaced, electrically conductive components 101 which are electrically coupled together, and which are positioned between the processing region and the exhaust region, and wherein at least one of the electrically conductive components rests, at least in part, on the electrically insulative layer 80.

Figure 11:
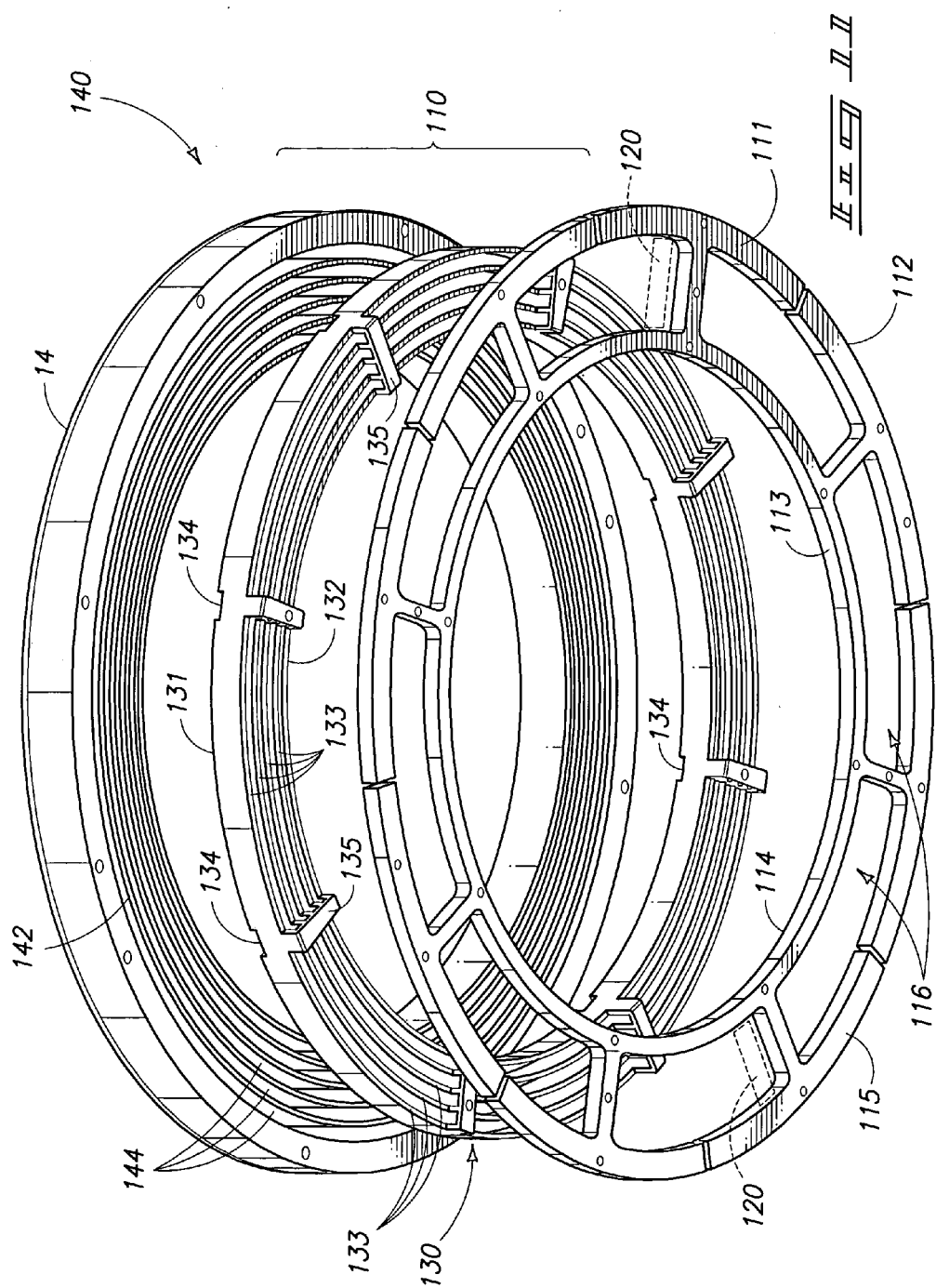
FIG. 11 is a perspective, exploded view of yet still another embodiment of the plasma confinement apparatus of the present invention.

Referring now to FIGS. 11 and 12, yet another form of the present invention is shown, and which is generally indicated by the numeral 110. As illustrated in those drawings, it will be understood that the present form of the invention 110 includes an electrically grounded member which is generally indicated by the numeral 111. The electrically grounded member 111 has a discontinuous outside peripheral edge generally indicated by the numeral 112, and further has an opposite, substantially continuous inside peripheral edge 113. Still further, the electrically grounded member 111 has a top surface 114, and an opposite bottom surface 115. Additionally, a plurality of passageways 116 are formed in the electrically grounded member 111 and extend between the top and bottom surfaces 114 and 115 thereof. Similar to that which was earlier described, the electrically grounded member 111 is positioned between the processing region, and the exhaust region of a plasma processing apparatus which is only shown in part and indicated by the numeral 117 in FIG. 12.

Similar to the form of the invention 70 is seen in FIGS. 9 and 10, the present invention includes an electrically insulative layer 120 which is shown, only in part, in FIG. 11, and which rests at least in partial covering relation relative to the top surface 114 of the electrically grounded member 111. Positioned or otherwise supported on the electrically insulative layer 120, is a first portion or plurality of spaced, concentrically oriented and electrically conductive members which are generally indicated by the numeral 130. As earlier discussed, the electrically conductive components may, in one form of the invention, be fabricated from a doped semiconductive material. As illustrated in FIGS. 11 and 12, the first portion or plurality of spaced concentrically and electrically conductive members are seen herein as concentric rings which are disposed in predetermined spaced relation one relative to the others. As will be appreciated, the respective spaced concentrically oriented members 130 have a top edge 131, and an opposite bottom edge 132. Still further, a plurality of passageways 133 are defined between the spaced concentrically oriented members, and are operable to receive a second portion, which will be described in greater detail in the paragraphs which follow. Additionally, and as seen in FIG. 11, a plurality of spaced notched regions 134 are formed in the top edge 131 of the respective spaced concentrically oriented members 130. Additionally, it will be seen that the plurality of spaced, concentrically oriented, and conductive members 130 are held in predetermined spaced relationship relative to the grounded member 111 by a plurality of support members 135. As illustrated, the plurality of support members are electrically insulated from the underlying grounded member 111 by the electrically insulative layer 120. Therefore, the first portion or plurality of spaced concentrically oriented members are positioned in predetermined spaced relationship relative to the electrically grounded member 111, and are positioned in electrically floating relationship relative to the plasma processing apparatus 117.

As illustrated in FIG. 11, the present form of the invention 110 includes a second portion or plurality of spaced, concentrically oriented and electrically conductive members or rings 140 which matingly interfit, and cooperate with, the first portion or plurality of electrically conductive members 130. As will be described below, the first and second plurality of electrically conductive and concentric members or rings define a plurality of passageways therebetween which have length dimensions which are greater than a mean free path length of a charged particle or species which may be formed in a plasma and which passes therethrough. In this regard, the second portion or plurality of spaced concentrically oriented and electrically conductive members or rings 140 have a top edge 141, and an opposite bottom edge 142. A portion of the bottom edge 142 of the respective rings rests thereagainst the respective plurality of support members 135 which are mounted on, or otherwise made integral with the bottom edge 132 of the respective first plurality of spaced concentrically oriented and conductive rings 130. As best illustrated by reference to FIG. 12, the second plurality of concentrically oriented rings includes a spaced, radially extending support member 143 which holds or secures the respective spaced concentrically oriented rings in substantially fixed spaced relationship one relative to the other. As best seen in FIG. 12, it will be appreciated that the individual support members are received in mating relation in the respective spaced notched regions 134 which are formed in top edges 131. Still further, and as best illustrated in FIG. 11, a plurality of passageways 144 are defined, therebetween, the respective spaced concentrically oriented rings 140. These passageways 144 are oriented, and otherwise dimensioned so as to permit the respective spaced concentrically oriented rings 140 to be matingly interfitted and received therebetween the spaced, concentrically oriented rings 130, and within the individual passageways 133 defined between same. As will be seen by reference to FIG. 12, and once nested together in mating relationship as seen in that drawing, a resulting passageway 145 is defined therebetween the respective first and second pluralities of spaced concentrically oriented and electrically conductive rings 130 and 140, respectively. These passageways 145, as noted earlier, each have a length dimension which is greater than a mean free path length of any charged particle which may be formed in a plasma and which passes therethrough. As will be recognized from the discussion above, the first and second rings are electrically floating and may be further formed of aluminum which is anodized thereafter, or further which may be first anodized and then coated with a material which resists etching by the plasma such as, for example, $Y_2O_3$.

It should be recognized that since the electrically conductive member 100 is electrically insulated relative to the ground during semiconductor processing, the electrical potential of the electrically conductive member is substantially equal to the plasma which is generated. In view of this electrical state of the electrically conductive member 100, electrical particles or species in the generated plasma and the resulting depleted or by-product process gases will not be encouraged to accelerate and strike or sputter on the electrically conductive member 100. This, of course, significantly reduces the generation of contamination particles which would reduce semiconductor through-put.

Therefore, it will be seen that the present invention provides an apparatus which substantially prevents charged particles from leaving the process region of a plasma processing apparatus 11 and further substantially inhibits the generation of a secondary plasma outside of the processing region thereof.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A plasma confinement apparatus for use in a plasma processing apparatus, wherein the plasma processing apparatus is defined by a sidewall having an inside facing surface, and wherein the plasma confinement apparatus is positioned between a processing region and an exhaust region and between the inside facing surface and a bottom electrode of the plasma processing apparatus, the plasma confinement apparatus comprising:
an electrically grounded member which substantially inhibits RF emissions from reaching the exhaust region;
an electrically conductive member which is positioned on the electrically grounded member and electrically insulated relative to the electrically grounded member thereto, and which further defines a plurality of passageways through which a plasma may pass between the processing region and the exhaust region, and wherein the plasma has charged species and neutral species, and wherein the plurality of passageways are sized so as to quench the charged species and allow the neutral species to pass therethrough; and,
an electrically insulative layer located between a top surface of the electrically grounded member and a bottom surface of the electrically conductive member;
wherein the electrically grounded member, comprises:
a discontinuous outside peripheral edge;
a substantially continuous inside peripheral edge; and,
a plurality of second passageways.

2. A plasma confinement apparatus as claimed in claim 1, and wherein the electrically grounded member or the electrically conductive member are anodized, at least in part.

3. A plasma confinement apparatus as claimed in claim 1, and wherein the electrically conductive member is coated with a material which is substantially resistant to etching by a plasma which is produced in the processing region of the plasma processing apparatus.

4. A plasma confinement apparatus as claimed in claim 3, and wherein the electrically conductive member or the electrically grounded member are first anodized, at least in part, before the material which resists etching is coated on the electrically conductive member.

5. A plasma confinement apparatus as claimed in claim 1, and wherein the electrically insulative layer is formed by either anodization or coating a surface of the electrically grounded member or the electrically conductive member.

6. A plasma confinement apparatus as claimed in claim 1, and wherein the electrically conductive member is formed of a plurality of concentric rings.

7. A plasma confinement apparatus as claimed in claim 1, and wherein the electrically conductive member comprises a plate which has slotted perforations or holes formed therein.

8. A plasma confinement apparatus as claimed in claim 1, and wherein the electrically conductive member is electrically floated from ground.

9. A plasma confinement apparatus as claimed in claim 8, and wherein the electrically conductive member has a first and second portion which matingly cooperate together to define the plurality of passageways which are sized so as to quench charged species of the plasma and allow neutral species to pass therethrough.

10. A plasma confinement apparatus for use in a plasma processing chamber having a processing region and an exhaust region and wherein an RF emission is provided to the processing region to energize a plasma; comprising:

an electrically grounded member having a top surface and which substantially inhibits RF emissions from reaching the exhaust region;

an electrically insulative spacer located on top of the electrically grounded member; and, an electrically conductive member which is positioned on the electrically insulative spacer and is electrically insulated relative to the electrically grounded member, and which further defines a plurality of passageways through which a plasma may pass between the processing region and the exhaust region, and wherein the plasma has charged species and neutral species, and wherein the plurality of passageways are sized so as to quench the charged species and allow the neutral species to pass therethrough;

wherein the electrically grounded member, comprises:

a discontinuous outside peripheral edge;

a substantially continuous inside peripheral edge; and, a plurality of second passageways.

11. A plasma confinement apparatus as claimed in claim 10, and wherein the electrically conductive member is formed of a plurality of concentric rings.

* * * * *